US012738935B2

(12) United States Patent
Khanna et al.

(10) Patent No.: US 12,738,935 B2
(45) Date of Patent: Sep. 15, 2026

(54) UNIDIRECTIONAL SWITCH CIRCUIT

(71) Applicant: IDEAL POWER INC., Austin, TX (US)

(72) Inventors: Mudit Khanna, Austin, TX (US); Ruiyang Yu, Austin, TX (US); Jiankang Bu, Austin, TX (US); Yifan Jiang, Austin, TX (US); R. Daniel Brdar, Driftwood, TX (US)

(73) Assignee: IDEAL POWER INC., Austin, TX (US)

(*) Notice: Subject to any disclaimer, the term of this patent is extended or adjusted under 35 U.S.C. 154(b) by 1 day.

(21) Appl. No.: 19/179,006

(22) Filed: Apr. 15, 2025

(65) Prior Publication Data

US 2025/0373245 A1 Dec. 4, 2025

Related U.S. Application Data

(60) Provisional application No. 63/652,330, filed on May 28, 2024.

(51) Int. Cl.
*H03K 17/567* (2006.01)
*H03K 17/60* (2006.01)
*H03K 17/687* (2006.01)

(52) U.S. Cl.
CPC .......... *H03K 17/567* (2013.01); *H03K 17/60* (2013.01); *H03K 17/687* (2013.01)

(58) Field of Classification Search
CPC ..... H03K 17/567; H03K 17/60; H03K 17/687
See application file for complete search history.

(56) References Cited

U.S. PATENT DOCUMENTS

| | | | |
|---|---|---|---|
| 6,153,495 | A | 11/2000 | Kub et al. |
| 7,220,661 | B1 | 5/2007 | Yu et al. |
| 7,235,735 | B2 | 6/2007 | Venkatasubramanian et al. |
| 7,599,196 | B2 | 10/2009 | Alexander |
| 7,778,045 | B2 | 8/2010 | Alexander |

(Continued)

FOREIGN PATENT DOCUMENTS

| | | | |
|---|---|---|---|
| DE | 102021203861 | A1 | 10/2022 |
| EP | 3185421 | B1 | 12/2020 |

(Continued)

OTHER PUBLICATIONS

European Patent Office, Search Report and Written Opinion for International Application No. PCT/2025/024649, Date of Mailing Jul. 25, 2025, 11 pages.

(Continued)

*Primary Examiner* — Patrick O Neill
(74) *Attorney, Agent, or Firm* — Dickinson Wright PLLC; Damian M. Aquino

(57) ABSTRACT

A switch circuit for coupling two circuit terminals together is disclosed. The switch circuit includes a double-base bipolar junction transistor and a field-effect transistor coupled, in series, between a first terminal and a second terminal. Various driver circuits may be employed to activate, in response to an activation of a switch signal, the field-effect transistor, and couple one or both of the base terminals of the double-base bipolar junction transistor to voltage sources to initiate base currents to reduce the channel resistance of the double-base bipolar junction transistor.

20 Claims, 12 Drawing Sheets

(56) References Cited

U.S. PATENT DOCUMENTS 8,295,069 B2 10/2012 Alexander
8,300,426 B2 10/2012 Alexander
8,345,452 B2 1/2013 Alexander
8,391,033 B2 3/2013 Alexander
8,395,910 B2 3/2013 Alexander
8,400,800 B2 3/2013 Alexander
8,406,025 B1 3/2013 Alexander
8,432,711 B1 4/2013 Alexander
8,441,819 B2 5/2013 Alexander
8,446,042 B2 5/2013 Bundschuh et al.
8,446,745 B1 5/2013 Alexander
8,451,637 B1 5/2013 Alexander
8,461,718 B2 6/2013 Bundschuh et al.
8,471,408 B2 6/2013 Bundschuh et al.
8,514,601 B2 8/2013 Alexander
8,531,858 B2 9/2013 Alexander
8,674,470 B1 3/2014 Or-Bach et al.
9,007,796 B2 4/2015 Alexander
9,029,909 B2 5/2015 Blanchard et al.
9,035,350 B2 5/2015 Blanchard et al.
9,042,131 B2 5/2015 Barron et al.
9,054,706 B2 6/2015 Blanchard et al.
9,054,707 B2 6/2015 Blanchard et al.
9,059,710 B2 6/2015 Blanchard et al.
9,077,185 B2 7/2015 Alexander
9,118,247 B2 8/2015 Alexander
9,130,461 B2 9/2015 Alexander
9,159,819 B2 10/2015 Pfirsch et al.
9,178,092 B2 11/2015 Bui et al.
9,190,894 B2 11/2015 Alexander et al.
9,203,400 B2 12/2015 Alexander et al.
9,203,401 B2 12/2015 Alexander et al.
9,209,713 B2 12/2015 Alexander et al.
9,209,798 B2 12/2015 Alexander et al.
9,231,582 B1 1/2016 Alexander et al.
9,270,142 B2 2/2016 Alexander
9,293,946 B2 3/2016 Alexander
9,337,262 B2 5/2016 Blanchard
9,355,353 B2 5/2016 Von Mueller et al.
9,355,853 B2 5/2016 Blanchard et al.
9,356,595 B2 5/2016 Alexander et al.
9,444,449 B2 9/2016 Alexander et al.
9,647,553 B2 5/2017 Alexander et al.
9,742,385 B2 8/2017 Alexander
9,742,395 B2 8/2017 Alexander et al.
9,787,298 B2 10/2017 Alexander et al.
9,818,615 B2 11/2017 Blanchard et al.
9,899,932 B2 2/2018 Alexander
10,056,372 B2 8/2018 Alexander
10,211,283 B2 2/2019 Alexander et al.
10,418,471 B2 9/2019 Alexander et al.
10,497,699 B2 12/2019 Alexander
10,580,885 B1 3/2020 Alexander et al.
10,892,354 B2 1/2021 Alexander et al.
10,964,664 B2 3/2021 Mandalapu et al.
11,069,797 B2 7/2021 Blanchard et al.
11,411,557 B2 8/2022 Mojab
11,496,129 B2 11/2022 Mojab
11,522,051 B2 12/2022 Mojab et al.
11,538,762 B2 12/2022 Chun
11,637,016 B2 4/2023 Blanchard et al.
11,699,746 B2 7/2023 Blanchard et al.
11,777,018 B2 10/2023 Blanchard et al.
11,804,835 B2 10/2023 Mojab
11,881,525 B2 1/2024 Bu et al.
11,888,030 B2 1/2024 Wood et al.
12,148,819 B2 11/2024 Bu et al.
2002/0004287 A1 1/2002 Ravi
2002/0094607 A1 7/2002 Gebauer et al.
2002/0180013 A1 12/2002 Brofman et al.
2004/0020513 A1 2/2004 Bergman
2005/0280155 A1 12/2005 Lee
2006/0138643 A1 6/2006 Lu et al.
2007/0037319 A1 2/2007 Chan et al.
2012/0051100 A1 3/2012 Alexander
2012/0279567 A1 11/2012 Alexander
2013/0307336 A1 11/2013 Bundschuh et al.
2013/0314096 A1 11/2013 Bundschuh et al.
2013/0342262 A1 12/2013 Konstantinov
2014/0319911 A1 10/2014 Alexander
2015/0061569 A1 3/2015 Alexander et al.
2015/0214782 A1 7/2015 Alexander
2015/0222146 A1 8/2015 Alexander
2015/0222194 A1 8/2015 Bundschuh
2015/0318704 A1 11/2015 Barron et al.
2016/0241232 A1 8/2016 Alexander et al.
2016/0322350 A1 11/2016 Blanchard
2016/0322484 A1 11/2016 Blanchard
2016/0329324 A1 11/2016 Blanchard
2016/0329418 A1 11/2016 Blanchard
2016/0344300 A1 11/2016 Alexander
2017/0287721 A1 10/2017 Wood et al.
2017/0288561 A1 10/2017 Lemberg et al.
2017/0317575 A1 11/2017 Alexander
2017/0345917 A1 11/2017 Basler et al.
2018/0026122 A1 1/2018 Blanchard et al.
2018/0109101 A1 4/2018 Alexander
2018/0226254 A1 8/2018 Blanchard et al.
2019/0140548 A1 5/2019 Alexander
2019/0267810 A1 8/2019 Johns
2019/0363196 A1 11/2019 Wood
2020/0006945 A1 1/2020 Lemberg et al.
2021/0398977 A1 12/2021 Mishra et al.
2023/0066664 A1 3/2023 Mojab et al.
2023/0299188 A1 9/2023 Blanchard et al.
2023/0386987 A1 11/2023 Bu et al.
2024/0154029 A1 5/2024 Brdar et al.
2024/0194736 A1 6/2024 Bu et al.
2024/0396546 A1 11/2024 Khanna et al.
2025/0080107 A1 3/2025 Yu et al.
2025/0112634 A1 4/2025 Khanna et al.
2025/0192771 A1 6/2025 Yu et al.
2025/0266827 A1* 8/2025 Yu .......................... H03K 17/60
2025/0364989 A1* 11/2025 Khanna .................. H03K 17/68

FOREIGN PATENT DOCUMENTS

EP 3913806 A1 11/2021
WO 99/46809 A1 9/1999
WO 03/007354 A1 1/2003
WO 2014122472 A1 8/2014
WO 2016000840 A1 7/2016

OTHER PUBLICATIONS

European Patent Office, Search Report and Written Opinion for International Application No. PCT/2025/026149, Date of Mailing Jul. 17, 2025, 13 pages.

Wang, Zheng, et al., A Reliable Double-Sided 1200-V/600—A Multichip Half-bridge Insulated Gate Bipolar Transistor (IGBT) Module with High Power Density.

Lai, Ruby A., et al., “Double-Sided Transistor Device Processability of Carrierless Ultrathin Silicon Wafers”, Wiley, DOI: 10.1002/inf2.12087, Dec. 2019, 8 pages.

Corradino, Thomas, et al., “Design and Characterization of Backside Termination Structures for Thick Fully-Depleted MAPS”, Sensors, doi.org/10.3390/s21113809, May 2021, 17 pages.

Mojab, Alireza, et al., “Operation and Characterization of Low-Loss Bidirectional Bipolar Junction TRANsistor (B-Tran TM)”, Applied Power Electronics Conference and Exposition (APEC), Mar. 2022, 5 pages, doi: 10.1109/APEC43599.2022.9773733.

Dong Mouzhi et al: “B-TRAN (TM) Optimization and Performance Characterization”, published in 2023 IEEE Applied Power Electronics Conference and Exposition (APEC), IEEE, Mar. 19, 2023 (Mar. 19, 2023), pp. 1835-1839, XP034351114, DOI: 10.1109/APEC3580.2023.10131453 [retrieved on May 31, 2023 p. 1838; figure 12.

* cited by examiner

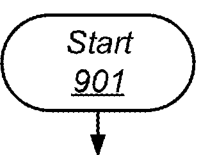

Receiving, by a switch circuit, a switch signal, wherein the switch circuit includes a double-base bipolar junction transistor and a first field-effect transistor coupled, in series, between a first terminal and a second terminal
902

In response to activating the switch signal, where a first voltage level of the first terminal is greater than a second voltage level of the second:

Activating the first field-effect transistor
903

Coupling an upper-base of the double-base bipolar junction transistor to a voltage source to enable a forward current to flow from the first terminal to the second terminal
904

In response to activating the switch signal, where a first voltage level of the first terminal is less than a second voltage level of the second:

Coupling the upper-base of the double-base bipolar junction transistor to the voltage source to enable a reverse current to flow from the second terminal to the first terminal through a body diode of the first field-effect transistor and the double-base bipolar junction transistor
905

End
906

FIG. 9

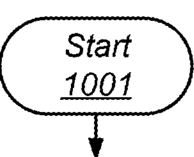
Receiving, by a switch circuit, a switch signal, wherein the switch circuit includes a double-base bipolar junction transistor and a first field-effect transistor coupled, in series, between a first terminal and a second terminal
1002
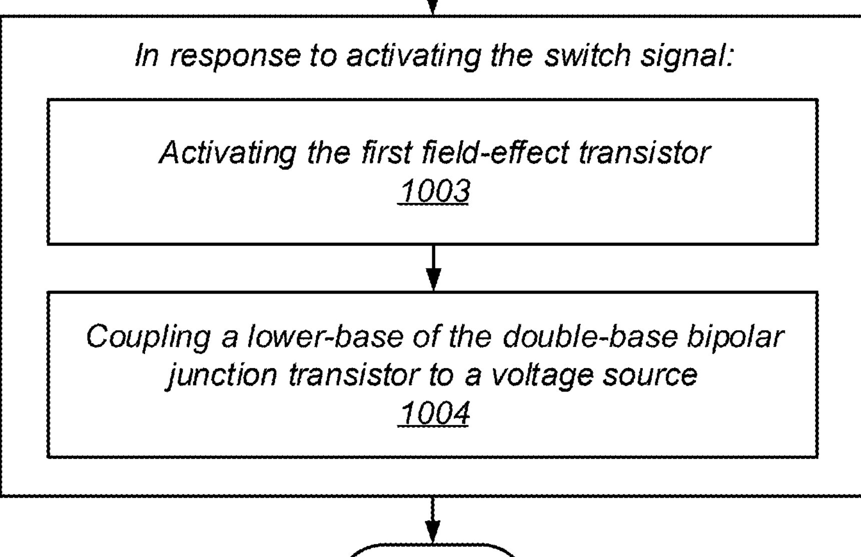
End
1005
FIG. 10

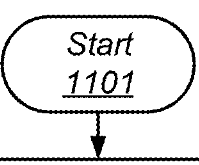
Receiving, by a switch circuit, a switch signal, wherein the switch circuit includes a double-base bipolar junction transistor and a first field-effect transistor coupled, in series, between a first terminal and a second terminal 1102
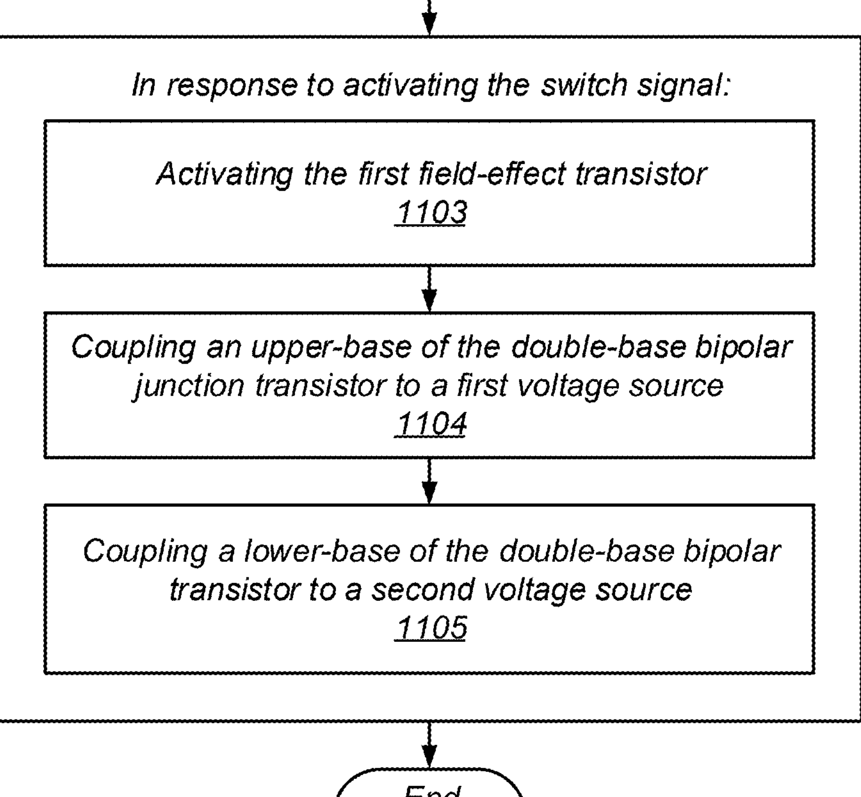
End
1106
FIG. 11

UNIDIRECTIONAL SWITCH CIRCUIT

CROSS-REFERENCE TO RELATED APPLICATIONS

This application claims the benefit of U.S. Provisional Application No. 63/652,330, filed on May 28, 2024. The entire disclosure of the applications referenced above is incorporated herein by reference.

BACKGROUND

Technical Field

This disclosure is related to electrically controlled switches and, more particularly, to hybrid switches that include bidirectional double-base bipolar junction transistors ("BDB BJT").

Description of the Related Art

Many electrical systems make use of high voltages and currents. Such electrical systems may be employed in a variety of applications ranging from electric vehicles to consumer appliances. For example, in some electric vehicles, voltages on the order of 1200 Volts may be used to power electric motors.

During operation of such electrical systems, it may be necessary to disconnect or decouple a load circuit from a high-voltage source. To accomplish this, electrically controlled switches may be employed. In response to an assertion of a switch signal, an electrically controlled switch can couple a power source to a load circuit. The electrically controlled switch can additionally decouple the load circuit from the power source in response to a de-assertion of the switch signal.

SUMMARY

Various embodiments of a switch circuit coupled between a first terminal and a second terminal are disclosed. Broadly speaking, a switch circuit may include a switch device coupled between the first terminal and the second terminal, where the switch device includes a double-base bipolar junction transistor and a first field-effect transistor. The switch circuit may further include a driver circuit configured, in response to an activation of a switch signal, to activate the first field-effect transistor, and couple an upper-base of the double-base bipolar junction transistor to a voltage source.

In some embodiments, the driver circuit includes a second field-effect transistor coupled between the upper-base of the double-base bipolar junction transistor and the voltage source, where the voltage source is further coupled to the first terminal. To couple the upper-base of the double-base bipolar junction transistor to the voltage source, the driver circuit is further configured to activate the second field-effect transistor.

In other embodiments, the driver circuit is further configured, in response to a deactivation of the switch signal, to decouple the upper-base of the double-base bipolar junction transistor from the voltage source, and couple a lower-base of the double-base bipolar junction transistor to the second terminal. The driver circuit may be further configured, in response to the deactivation of the switch signal, to deactivate the first field-effect transistor in response to a determination that a particular time period has elapsed since the deactivation of the switch signal.

BRIEF DESCRIPTION OF THE DRAWINGS

For a detailed description of example embodiments, reference will now be made to the accompanying drawings in which:

FIG. 9 is a flow diagram of an embodiment of a method for operating a switch circuit with a high-side driver.

FIG. 10 is a flow diagram of an embodiment of a method for operating a switch circuit with a low-side driver.

FIG. 11 is a flow diagram of an embodiment of a method for operating a switch circuit with a double-side driver.

Figure 1:
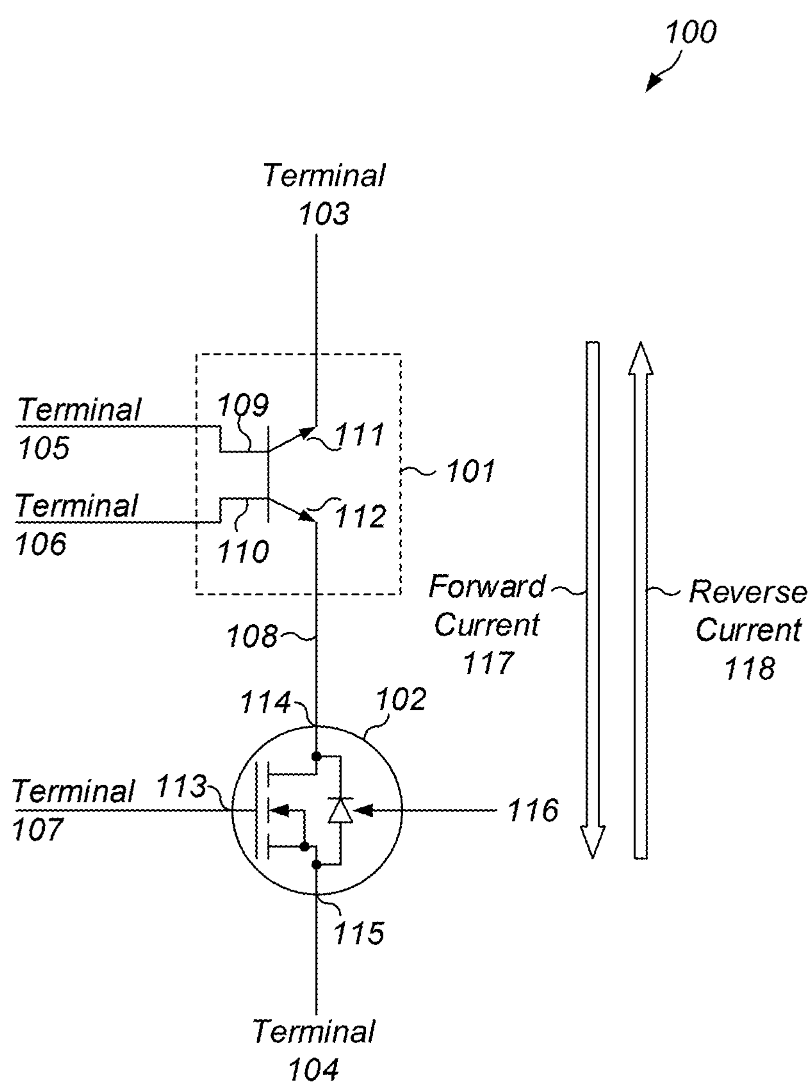
FIG. 1 is a block diagram of an embodiment of a switch device that includes a double-base bipolar junction transistor.

Many of the electrical connections in the drawings are shown as direct couplings having no intervening devices, but not expressly stated as such in the following description. Nevertheless, this paragraph shall serve as antecedent basis in the claims for referencing any electrical connection as "directly coupled" for electrical connections shown in the drawing with no intervening device(s).

Definitions

Various terms are used to refer to particular system components. Different companies may refer to a component by different names—this document does not intend to distinguish between components that differ in name but not function. In the following discussion and in the claims, the terms "including" and "comprising" are used in an open-ended fashion and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

"A," "an," and "the," as used herein, refers to both singular and plural referents unless the context clearly dictates otherwise. By way of example, "a processor" programmed to perform various functions refers to one processor programmed to perform each and every function, or more than one processor collectively programmed to perform each of the various functions.

In relation to electrical devices (whether stand alone or as part of an integrated circuit), the terms "input" and "output" refer to electrical connections to the electrical devices, and shall not be read as verbs requiring action. For example, a differential amplifier (such as an operational amplifier) may have a first differential input and a second differential input, and these "inputs" define electrical connections to the operational amplifier, and shall not be read to require inputting signals to the operational amplifier.

"Assert" shall mean creating or maintaining a first predetermined state of a Boolean signal. Boolean signals may be asserted high, or with a higher voltage, and Boolean signals may be asserted low, or with a lower voltage, at the discretion of the circuit designer. Similarly, "de-assert" shall mean creating or maintaining a second predetermined state of the Boolean signal, opposite the asserted state.

"FET" shall mean a field-effect transistor, such as a junction-gate FET (JFET) or a metal-oxide semiconductor field effect transistor (MOSFET).

"Closing" in reference to an electrically controlled switch (e.g., a FET) shall mean making the electrically controlled switch conductive. For example, closing a FET used as an electrically controlled switch may mean driving the FET to a full conductive state.

"Opening" in reference to an electrically controlled switch (e.g., a FET) shall mean making the electrically controlled switch non-conductive.

"Bidirectional double-base bipolar junction transistor" shall mean a junction transistor having a base and a collector-emitter on a first face, or first side, of a bulk region, and having a base and a collector-emitter on a second face, or second side, of the bulk region. The base and collector-emitter on the first side are distinct from the base and the collector-emitter on the second side.

"Collector-emitter" of a bipolar junction transistor shall mean a region of the bipolar junction transistor through which main load current flows. For purposes of this specification and claims, the designation as a collector-emitter is independent of the underlying device physics within the bipolar junction transistor. For example, for a double-sided, double-base PNP transistor, the main load current may flow from an upper P-type region, through the bulk N-type region, and then out the lower P-type region, and when so used the upper P-type region and the lower P-type region are considered collector-emitters. However, in other cases, such as described in co-pending and commonly assigned U.S. application Ser. No. 18/483,939 filed Oct. 10, 2023 and titled "Methods and Systems of Operating a PNP Bi-Directional Double-Base Bipolar Junction Transistor," the main load current may flow from an upper N-type region, through the bulk N-type region, and then through the lower N-type region, and when so used the upper and lower N-type regions are considered collector-emitters.

"Base" of a bipolar junction transistor shall mean a region of the bipolar junction transistor through which control current flows, the control current distinct from the main load current. For purposes of this specification and claims, the designation as a base is independent of the underlying device physics within the bipolar junction transistor. For example, for a double-sided, double-base PNP transistor, the control current may flow into an upper N-type region or a lower N-type region, and when so used the upper N-type region and the lower N-type region are considered bases. However, in other cases, such as described in co-pending and commonly assigned U.S. application Ser. No. 18/483,939 noted above, the control current may flow into an upper P-type region or a lower P-type region, and when so used the upper and lower P-type regions are considered bases.

"Upper" in reference to a component (e.g., upper collector-emitter, upper base) shall not be read to imply a location of the recited component with respect to gravity. Upper may be derived from location of the device in an example drawing.

"Lower" in reference to a component (e.g., upper collector-emitter, upper base) shall not be read to imply a location of the recited component with respect to gravity. Lower may be derived from location of the device in an example drawing.

"Upper collector-emitter" shall mean a terminal connected to a collector-emitter of a bidirectional double-base bipolar junction transistor on a first side of a bulk region of the transistor, and shall not be read to imply a location of the collector-emitter with respect to gravity.

"Lower collector-emitter" shall mean a terminal connected to a collector-emitter of a bidirectional double-base bipolar junction transistor on a second side of a bulk region of the transistor opposite a first side, and shall not be read to imply a location of the collector-emitter with respect to gravity.

"Upper base" shall mean a terminal connected to a base of a bidirectional double-base bipolar junction transistor on a first side of the transistor, and shall not be read to imply a location of the base with respect to gravity.

"Lower base" shall mean a terminal connected to a base of a bidirectional double-base bipolar junction transistor on a second side of the transistor opposite a first side, and shall not be read to imply a location of the base with respect to gravity.

"Controller" or "controller circuit" shall mean, alone or in combination, individual circuit components, an application specific integrated circuit (ASIC), a microcontroller with controlling software, a reduced-instruction-set computer (RISC) with controlling software, a digital signal processor (DSP), a processor with controlling software, a programmable logic device (PLD), a field programmable gate array (FPGA), or a programmable system-on-a-chip (PSOC), configured to read inputs and drive outputs responsive to the inputs.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

In various applications, switching of high voltages and currents may be needed. For example, in some electric vehicles, coupling and decoupling a load circuit to a high voltage supply (e.g., 1200V) may be used. In many systems, silicon carbide (SiC) switches are employed. To handle large currents, many SiC switches may be coupled together in parallel so that each SiC switch handles only a portion of the overall current.

Using multiple SiC switches, however, can result in a large circuit area and higher cost. Additionally, increased drive capability may need to be added to the switch control signals used to control the multiple SiC switches, increasing power consumption and decreasing efficiency of the switch sub-system. To reduce the number of SiC switches needed, double-base bipolar junction transistors may also be employed, which allows for bidirectional operation.

In some applications, e.g., voltage source inverters, motor drives, DC-DC power supplies, and the like, unidirectional switches are desired. Such unidirectional switches can be implemented using field-effect transistors or insulated-gate bipolar transistors (IGBTs) with reverse diodes that can result in some of the disadvantages described above.

The embodiments described herein may provide techniques for implementing a switch circuit using a double-base bipolar junction transistor that enables unidirectional operation. By employing a double-base bipolar junction transistor in such a switch circuit, unidirectional switch circuits can be employed in applications that previously were not commercially attractive due to the cost of SiC and IGBT devices.

A block diagram of a switch device is depicted in FIG. 1. As illustrated, switch device 100 includes double-base bipolar junction transistor 101 and field-effect transistor 102. Double-base bipolar junction transistor 101 is coupled between terminal 103 and node 108, while field-effect transistor 102 is coupled between node 108 and terminal 104. Although the double-base bipolar junction transistor 101 and field-effect transistor 102 are depicted as single transistors, in other embodiments, either of the double-base bipolar transistor 101 or the field-effect transistor 102 may be implemented as any suitable number of transistors coupled together in parallel.

Switch device 100 is configured to selectively conduct forward current 117 from terminal 103 to terminal 104 when it is forward biased. Under reverse bias, switch device 100 is configured to non-selectively conduct reverse current 118 from terminal 104 to terminal 103. As used herein, forward bias refers to a condition when a voltage level of terminal 103 is greater than a voltage level of terminal 104, and reverse bias refers to a condition when the voltage level of terminal 104 is greater than the voltage level of terminal 103.

In various embodiments, double-base bipolar junction transistor 101 may be implemented as a B-TRAN™ brand device available from Ideal Power Inc. of Austin, Texas. Although the double-base bipolar junction transistor 101 is depicted as a PNP device, in other embodiments, double-base bipolar junction transistor 101 may also be implemented as an NPN device. Moreover, one example of double-base bipolar junction transistor 101 may be a device as described in U.S. application Ser. No. 18/483,939 filed Oct. 10, 2023 and titled "Methods and Systems of Operating a PNP Bi-Directional Double-Base Bipolar Junction Transistor," in which the main load current flows through what, from a device physics standpoint, would be considered base connections. To avoid confusion, for purposes of this disclosure and the claims, the main load current is said to flow to and through collector-emitters, and control currents are applied to bases even if, from a bipolar junction transistor device physics standpoint, the bipolar junction transistor is utilized as in the above-noted utility application.

Upper collector-emitter 111 of the double-base bipolar junction transistor 101 is coupled to terminal 103, while the lower collector-emitter 112 of double-base bipolar junction transistor 101 is coupled to node 108. Upper-base 109 of double-base bipolar junction transistor 101 is coupled to terminal 105, and lower-base 110 of double-base bipolar junction transistor 101 is coupled to terminal 106.

A control (or "gate") terminal 113 of the field-effect transistor 102 is coupled to terminal 107. Drain terminal 114 of the field-effect transistor 102 is coupled to node 108, while source terminal 115 of field-effect transistor 102 is coupled to terminal 104. In various embodiments, the field-effect transistor 102 includes body diode 116, which conducts current from terminal 104 to node 108 in situations where the voltage level of terminal 104 is greater than the voltage level of node 108 by at least the turn-on voltage of body diode 116. Field-effect transistor 102 may be, in different embodiments, implemented using a SiC device, an insulated-gate bipolar transistor (IGBT), a Gallium Nitride (GaN) transistor, or any other suitable wide bandgap transistor.

Under forward bias, the double-base bipolar junction transistor 101 is configured to conduct current through upper collector-emitter 111 and lower collector-emitter 112 based on a state of respective voltage levels of terminals 105 and 106. That is, under forward bias the switch device 100 may selectively conduct forward current. In various embodiments, different modes of operation of double-base bipolar junction transistor 101 may be achieved by changing the respective voltage levels of terminals 105 and 106, as well as the state of field-effect transistor 102. For example, the double-base bipolar junction transistor 101 may be placed in a "passive off" state by: electrically floating terminal 105 (which electrically floats upper base 109); coupling the terminal 106 to the terminal 104; and making the field-effect transistor 102 non-conductive.

Alternatively, double-base bipolar junction transistor 101 may be placed in a "passive on" state by: coupling the terminal 105 to the terminal 103; floating the terminal 106 to electrically float the lower base 110; and asserting the terminal 107 to make the field-effect transistor 102 conductive. It is noted that, in addition to the "passive on" and "passive off" states, additional operational states are possible, and of the possible operational states for double-base bipolar junction transistor 101, any suitable subset of the possible operational states may be employed during operation of switch device 100.

Under reverse bias, body diode 116 can conduct current from terminal 104 to node 108. Since double-base bipolar junction transistor 101 is symmetric, it can be activated to conduct current from node 108 to terminal 103, enabling reverse current 118 to flow from terminal 104 to terminal 103. In cases where the amount of current flowing through body diode 116 is insufficient for a given application, field-effect transistor 102 can also be made conductive to enable increased current flow from terminal 104 to terminal 103.

Figure 2:
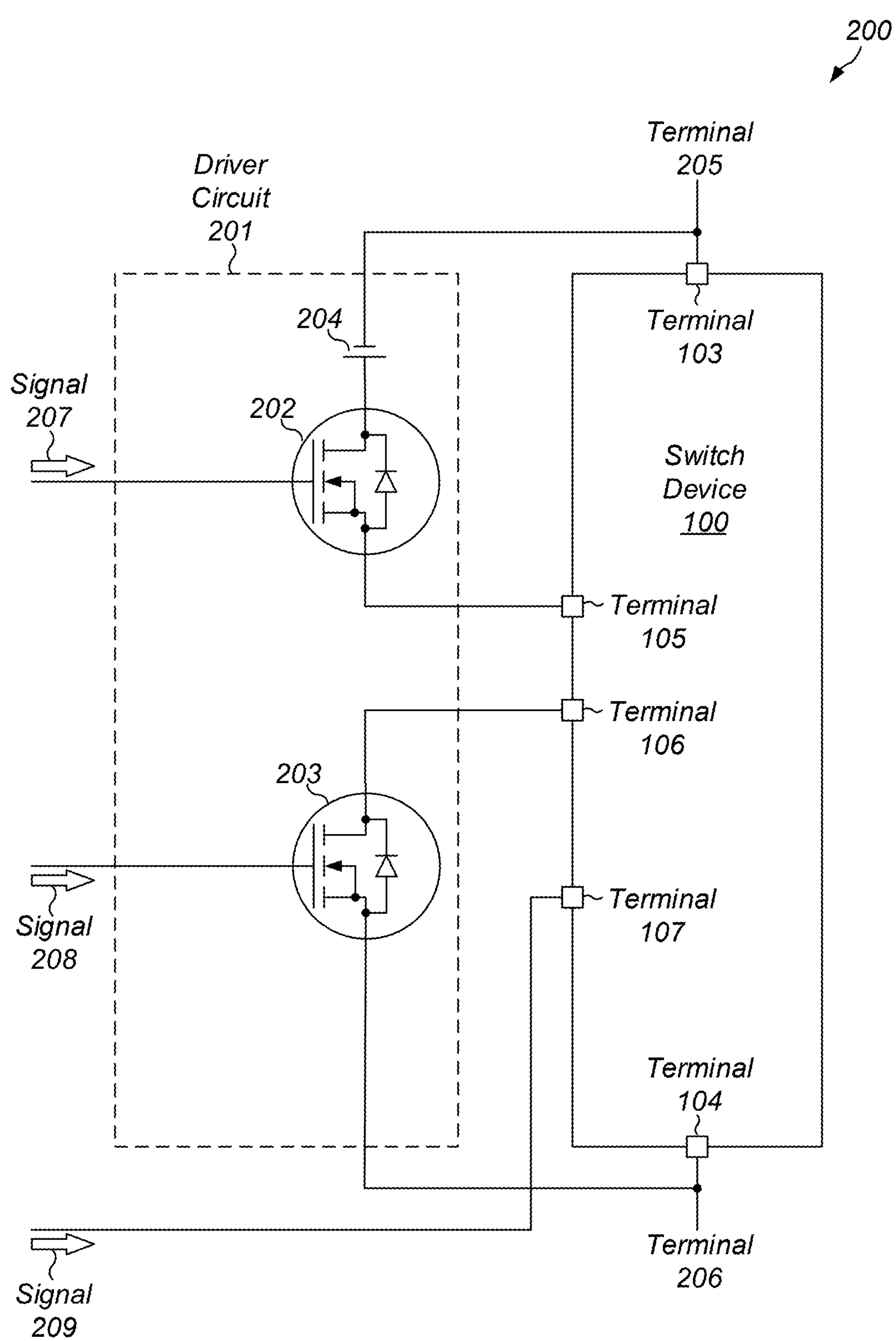
FIG. 2 is a block diagram of an embodiment of a switch circuit with a high-side driver.

Turning to FIG. 2, a block diagram of a switch circuit with a high-side driver is depicted. As illustrated, switch circuit 200 includes switch device 100 and driver circuit 201, which includes field-effect transistors 202 and 203, and voltage source 204.

Terminal 103 of switch device 100 is coupled to terminal 205, while terminal 104 of switch device 100 is coupled to terminal 206. Under forward bias, a voltage level of terminal 205 is greater than a voltage level of terminal 206. Terminal 105 of switch device 100 is coupled to a source terminal of field-effect transistor 202. Terminal 106 of switch device 100 is coupled to a drain terminal of field-effect transistor 203. Terminal 107 of switch device 100 is coupled to signal 209.

In various embodiments, a drain terminal of field-effect transistor 202 is coupled to voltage source 204, which is, in turn, coupled to terminal 205. A control (or "gate") terminal of field-effect transistor 202 is coupled to signal 207. In various embodiments, voltage source 204 may be implemented as a buck converter circuit, or any other suitable power converter circuit configured to generate a voltage level sufficient to activate double-based bipolar junction transistor, IGBT, a GaN transistor, or any other suitable wide bandgap transistor.

As described below, in response to an activation of a switch signal, signal 207 and signal 209 are asserted. In response to the assertion of signal 207, driver circuit 201 is configured to couple terminal 105, which is coupled to upper-base 109 of double-base bipolar junction transistor 101, to voltage source 204. To couple upper-base 109 to voltage source 204, driver circuit 201 is further configured to make the field-effect transistor 202 conductive. In various embodiments, the base current associated with upper-base 109 drives the channel resistance of double-base bipolar junction transistor 101 lower to lower the Vceon of the double-base bipolar junction transistor 101.

In response to the assertion of signal 209, switch device 100 is configured to couple lower collector-emitter 112 to terminal 104, which is, in turn, coupled to terminal 206. With lower collector-emitter 112 coupled to terminal 104, current can flow from terminal 205 to terminal 206. To couple lower collector-emitter 112 to terminal 104, switch device 100 is configured to make the field-effect transistor 102 conductive.

In response to a deactivation of the switch signal, signal 207 is de-asserted. In response to the de-assertion of signal 207, field-effect transistor 202 is made non-conductive, which decouples terminal 105 from voltage source 204. Once field-effect transistor 202 is non-conductive, current driven into upper-base 109 is halted. Also in response to the de-assertion of the switch signal, signal 208 is asserted, which activates field-effect transistor 203, coupling terminal 106 to terminal 206. By coupling lower-base 110 of double-base bipolar junction transistor 101 to terminal 206 via terminal 106, excess minority carriers in the drift region of double-base bipolar junction transistor 101 can be extracted via lower-base 110. In unidirectional applications, only lower-base 110 is used to extract the minority carriers.

After a predetermined period of time has elapsed since the deactivation of the switch signal, signal 209 is de-asserted. In response to the de-assertion of signal 209, field-effect transistor 102 goes non-conductive decoupling the lower collector-emitter 112 from terminal 104, which stops the load current path. Double-base bipolar junction transistor 101 starts blocking once the voltage on node 108 reaches its pinch-off voltage level, typically in the range of 40-50V.

Figure 3:
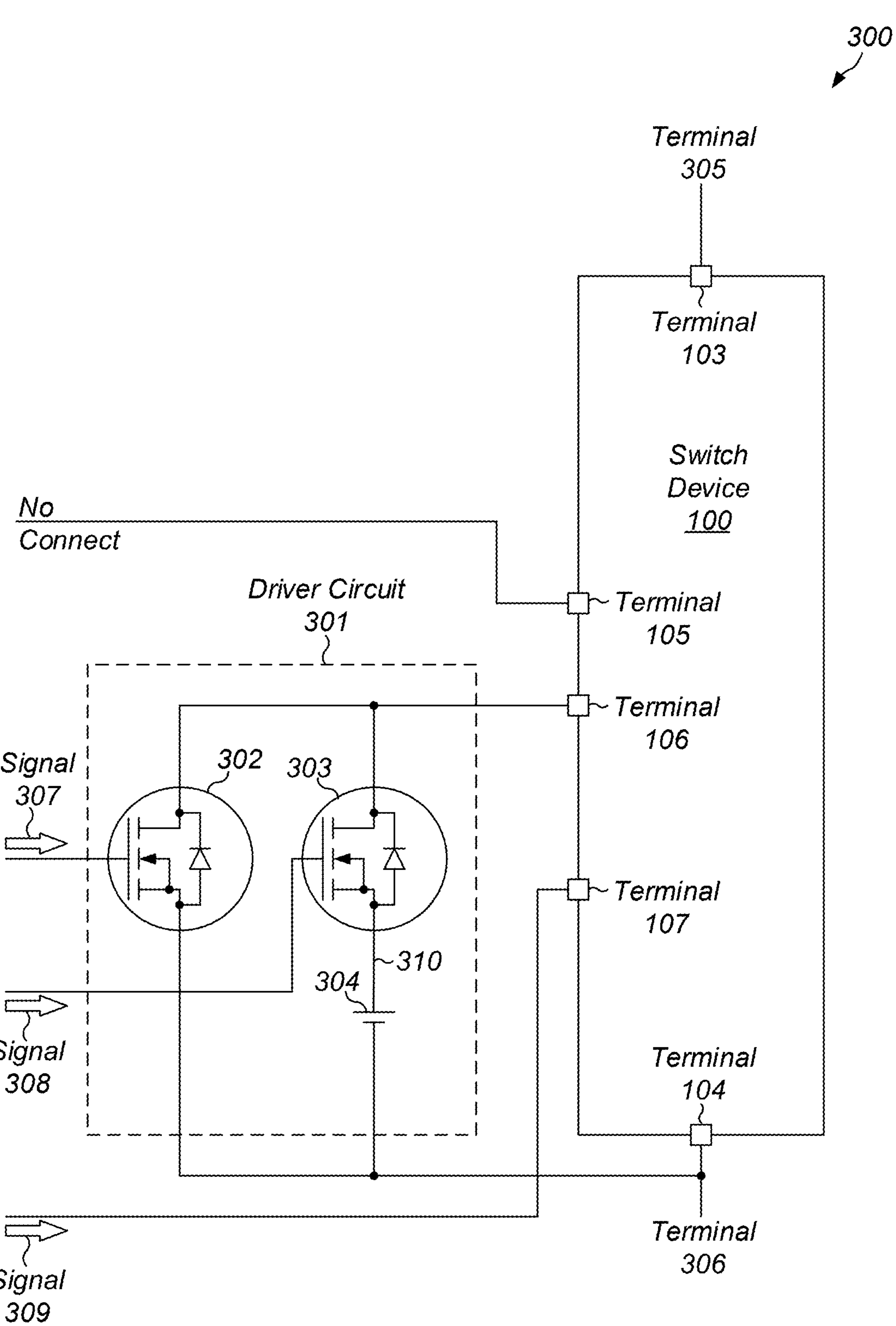
FIG. 3 is a block diagram of an embodiment of a switch circuit with a low-side driver.

Turning to FIG. 3, a block diagram of an embodiment of a switch circuit with a low-side driver is depicted. As illustrated, switch circuit 300 includes switch device 100 and driver circuit 301, which includes field-effect transistors 302 and 303, and voltage source 304.

Terminal 103 of switch device 100 is coupled to terminal 305, while terminal 104 of switch device 100 is coupled to terminal 406. In forward bias, a voltage level of terminal 305 may be greater than a voltage level of terminal 306. Terminal 105 of switch device 100 is left unconnected so that it is electrically floating. Terminal 106 of switch device 100 is coupled to respective drain terminals of field-effect transistors 302 and 303. Terminal 107 of switch device 100 is coupled to signal 309.

In various embodiments, a source terminal of field-effect transistor 303 is coupled to voltage source 304 via node 310, which is, in turn, coupled to terminal 306. A source terminal of field-effect transistor 302 is also coupled to terminal 306. A control (or "gate") terminal of field-effect transistor 303 is coupled to signal 308, and a gate terminal of field-effect transistor 302 is coupled to signal 307. In various embodiments, voltage source 304 may be implemented as buck converter circuit, or any other suitable power converter circuit configured to generate a voltage level sufficient to activate double-based bipolar junction transistor 101. In some embodiments, field-effect transistors 302 and 303 may be implemented using SiC devices, IGBTs, GaN transistors, or any other suitable wide bandgap transistors.

In response to assertion of a switch signal, signal 309 and signal 308 are asserted. In response to the assertion of signal 308, driver circuit 301 is configured to couple terminal 106, which is coupled to lower-base 110 of double-base bipolar junction transistor 100, to voltage source 304. To couple lower-base 110 to voltage source 304, driver circuit 301 is configured to make the field-effect transistor 303 conductive.

In response to assertion of signal 309, switch device 100 is configured to couple lower collector-emitter 112 to terminal 104, which is, in turn, coupled to terminal 306. To couple lower collector-emitter 112 to terminal 104, switch device 100 is configured to make conductive field-effect transistor 102 of switch device 100 in response to an activation of signal 309.

With the activation of field-effect transistor 303 and field-effect transistor 102, current from lower-base 110 drives the channel resistance of double-base bipolar junction transistor 101 lower.

In response to a de-assertion of the switch signal, signal 308 is de-asserted. In response to de-assertion of signal 408, field-effect transistor 303 becomes non-conductive, which decouples terminal 106 from voltage source 304. In addition to the de-assertion of signal 308, signal 307 is asserted, which makes field-effect transistor 302 conductive, coupling terminal 106 to terminal 306. With field-effect transistor 303 non-conductive and field-effect transistor 302 conductive, current driven into lower-base 110 is halted, and shorting lower-base 110 to terminal 306 enables excess minority carriers in the drift region of double-base bipolar junction transistor 101 to be extracted.

After a predetermined period of time has elapsed since the deactivation of the switch signal, signal 309 is de-asserted. In response to de-assertion of signal 309, field-effect transistor 102 is configured to decouple lower collector-emitter 112 from terminal 104, which stops the load current path. Double-base bipolar junction transistor 101 starts blocking once the voltage on node 108 reaches its pinch-off voltage level.

Figure 4:
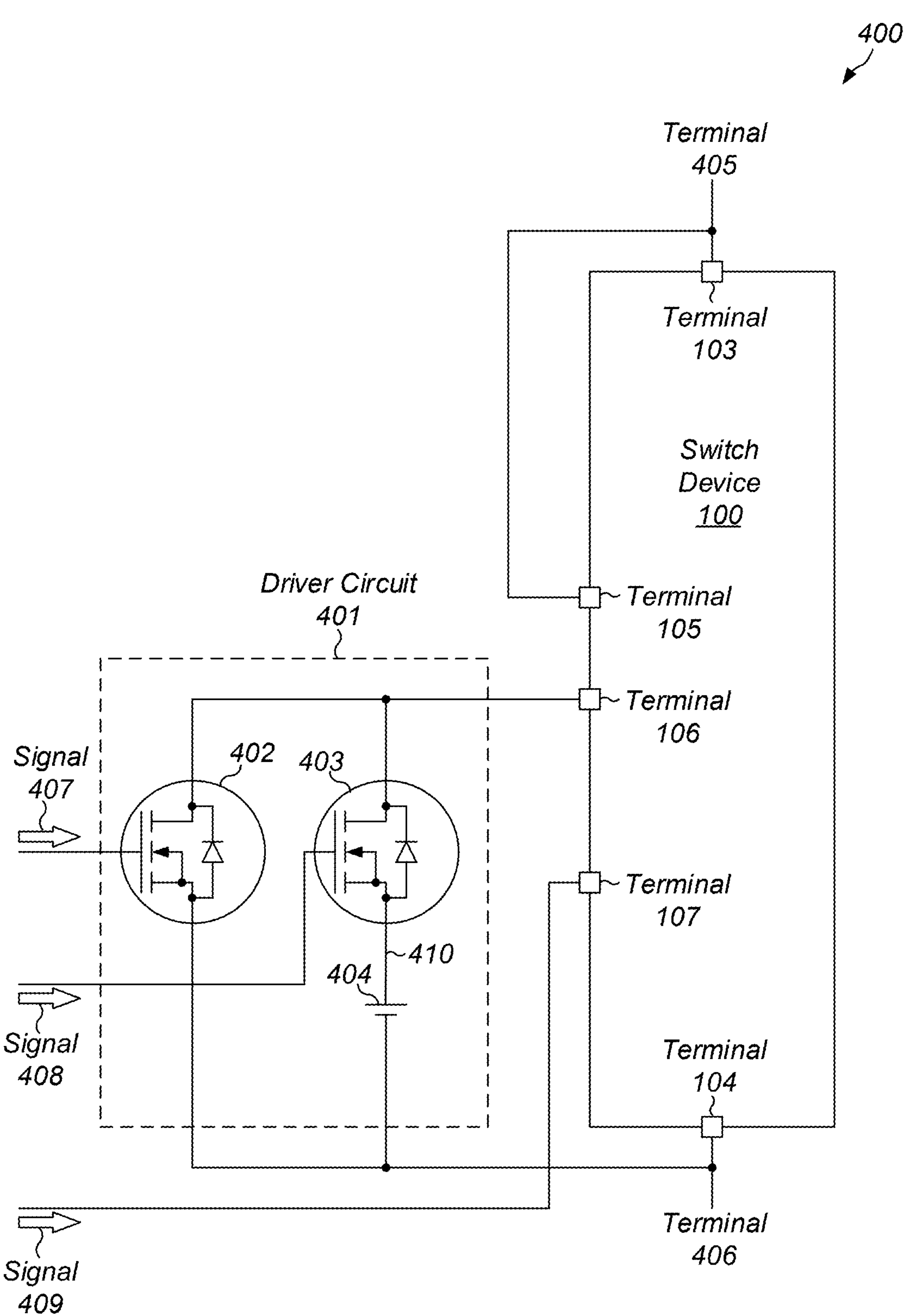
FIG. 4 is a block diagram of a different embodiment of a switch circuit with a low-side driver.

Turning to FIG. 4, a block diagram of another embodiment of a switch circuit with a low-side driver is depicted. As illustrated, switch circuit 400 includes switch device 100 and driver circuit 401, which includes field-effect transistors 402 and 403, and voltage source 404.

Terminal 103 of switch device 100 is coupled to terminal 405, while terminal 104 of switch device 100 is coupled to terminal 406. In forward bias, a voltage level of terminal 405 may be greater than a voltage level of terminal 406. Terminal 105 of switch device 100 is coupled to terminal 405, which couples upper-base 109 of double-base bipolar junction transistor 101 to terminal 405. Terminal 106 of switch device 100 is coupled to respective drain terminals of field-effect transistors 402 and 403. Terminal 107 of switch device 100 is coupled to signal 409. Operation of the system of FIG. 4 is similar to FIG. 3, except that when forward current is flowing, additional charge carriers are injected through the upper base associated with terminal 105.

Figure 5:
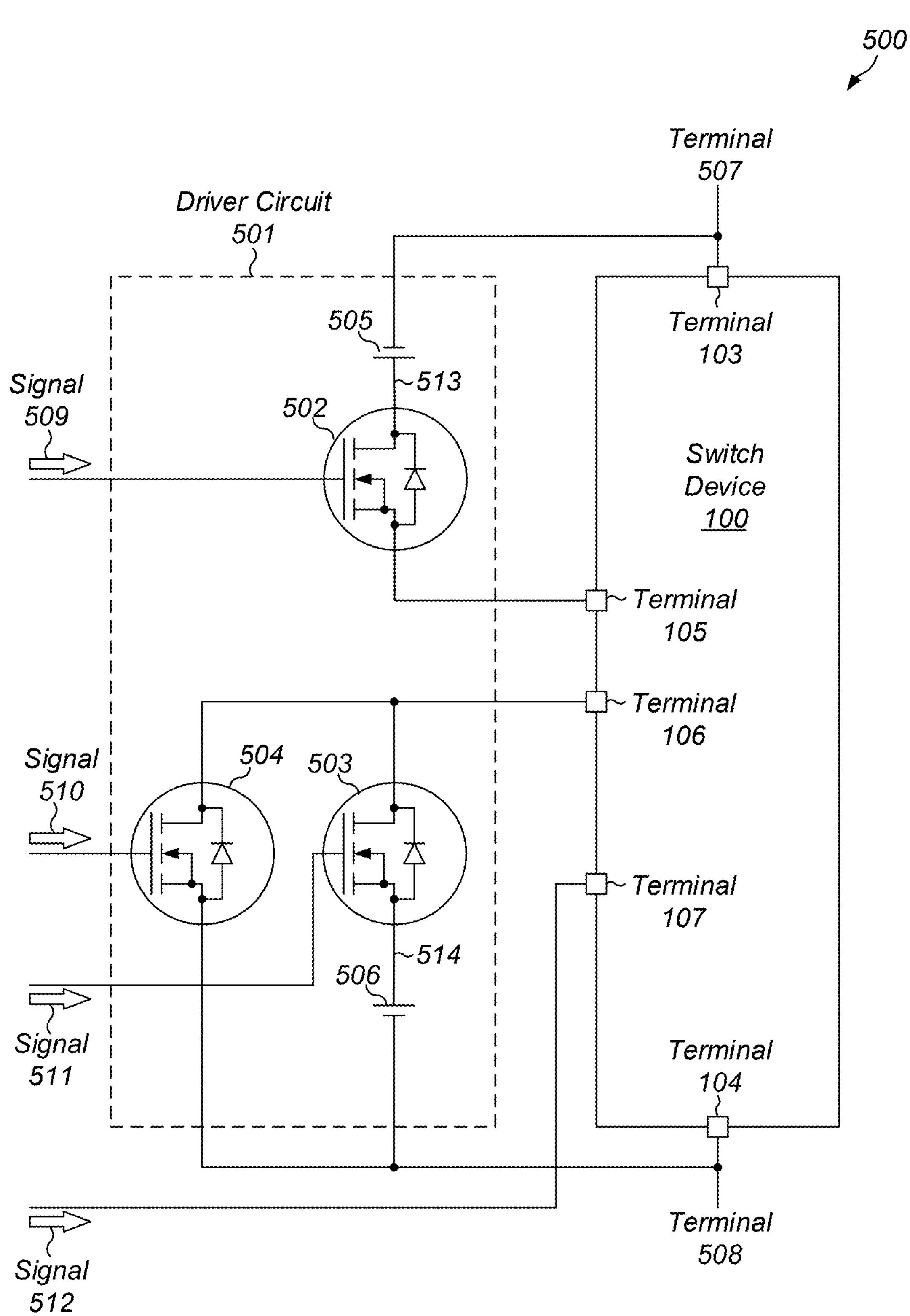
FIG. 5 is a block diagram of an embodiment of a switch circuit with a double-side driver.

Turning to FIG. 5, a block diagram of another embodiment of a switch circuit with a double-side driver is depicted. As illustrated, switch circuit 500 includes switch device 100 and driver circuit 501, which includes field-effect transistors 502-504, and voltage sources 505 and 506. Operation of the system of FIG. 5 is similar to FIG. 4, except that when forward current is flowing, additional charge carriers may be selectively injected through the upper base associated with terminal 105.

Figure 6:
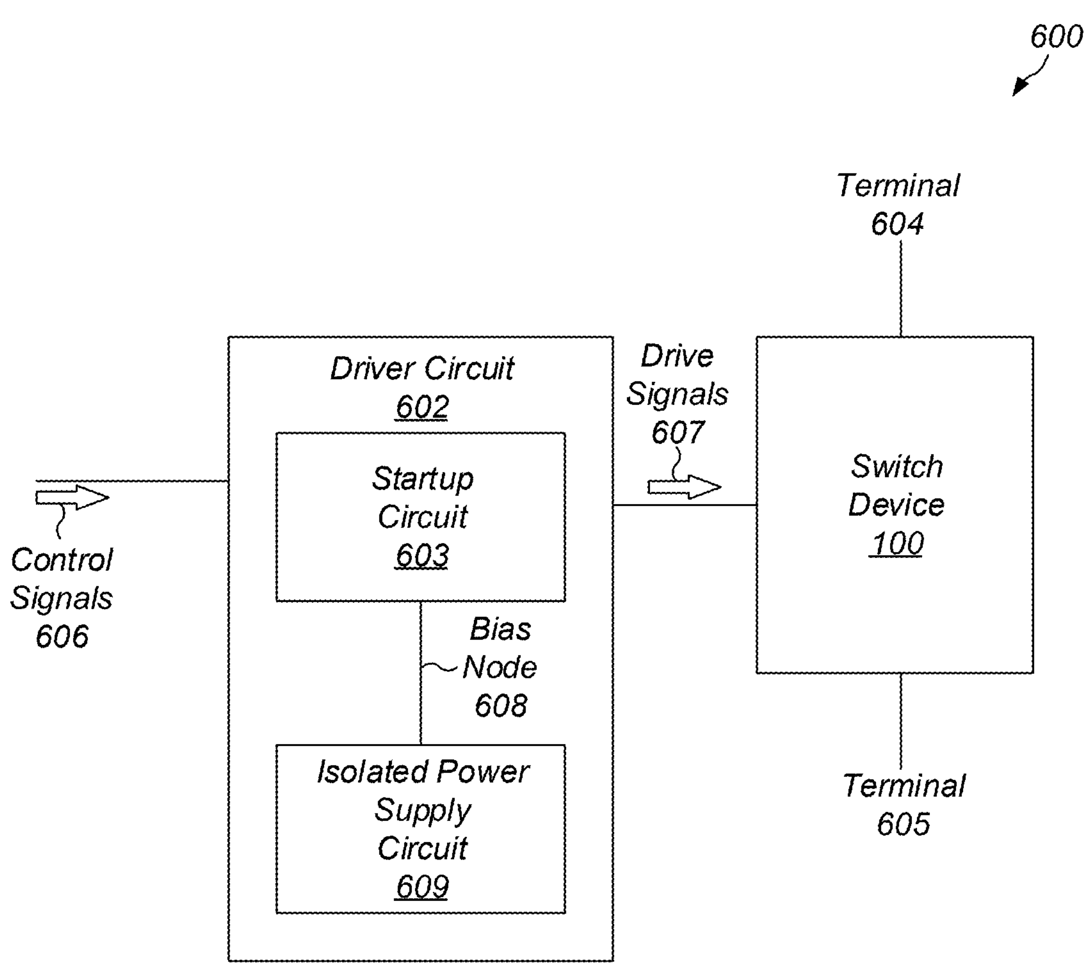
FIG. 6 is a block diagram of an embodiment of a switch circuit that includes a startup circuit.

Turning to FIG. 6, a block diagram of an embodiment of a switch circuit that includes a startup circuit is depicted. As illustrated, switch circuit 600 includes switch device 100 and driver circuit 602, which includes startup circuit 603 and isolated power supply circuit 609.

Switch device 100 is coupled between terminals 604 and 605. As described above, in response to different voltage levels on drive signals 607, switch device 100 is configured to selectively conduct a forward current from terminal 604 to terminal 605 when forward biased, and non-selectively conduct a reverse current from terminal 605 to terminal 604 when reverse biased.

Driver circuit 602 is configured to generate drive signals 607 using control signals 606. In various embodiments, control signals 606 may correspond to signals 207-209, signals 307-309, signals 407-409, or signals 509-512, depending on which type of driver circuit is employed.

In various embodiments, isolated power supply circuit 609 may be configured to generate one or more supply voltages used by voltage sources, e.g., voltage source 204, in a driver circuit to generate drive signals 607 to operate switch device 100. Isolated power supply circuit 609 may be implemented using any suitable switching power converter circuit. For example, in some cases, the isolated power supply circuit 609 may be implemented as a flyback power converter circuit.

During startup of switch circuit 600, isolated power supply circuit 609 may not be able to generate drive signals 607. In order to provide driver circuit 602 with sufficient power during a startup period, startup circuit 603 is configured to provide power to bias node 608. As described below, startup circuit 603 is configured to provide power to bias node 608 using double-base bipolar junction transistor 101 to transfer power from terminal 604 as opposed to an expensive high-depletion MOSFET, thereby reducing cost of switch device 600.

Under some startup conditions, the voltage level of terminal 103 is greater than the voltage level of terminal 104, and double-base bipolar junction transistor 101 is arranged for blocking, e.g., passive off. Additionally, field-effect transistor 102 is non-conductive, so the lower collector-emitter 112 is electrically floating. In this example situation, for voltages between 600V and 1200V on terminal 103, lower collector-emitter 112 carries a pinch-off voltage on the order of 20V relative to the neutral or ground. In various embodiments, the pinch-off voltage may be channeled through a transistor to provide startup power to isolated power supply circuit 609.

Figure 7:
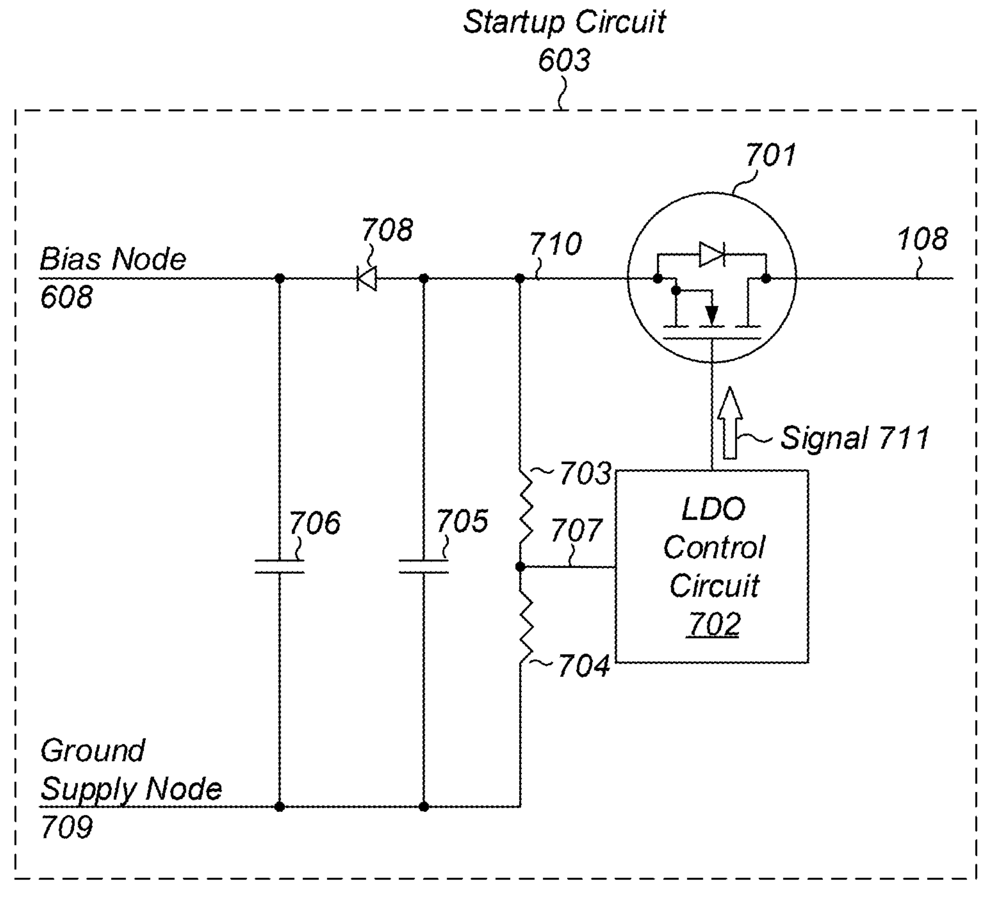
FIG. 7 is a block diagram of an embodiment of a startup circuit for a switch circuit.

Turning to FIG. 7, a block diagram of an embodiment of startup circuit 603 is depicted. As illustrated, startup circuit 603 includes field-effect transistor 701, low dropout control circuit 702 (denoted "LDO control circuit 702"), resistors 703 and 704, capacitors 705 and 706, and diode 708.

Field-effect transistor 701 is coupled between node 108 of switch device 100 and node 710. A gate terminal of field-effect transistor 701 is coupled to signal 708, which is generated by LDO control circuit 702. In various embodiments, field-effect transistor 701 may be implemented using a SiC device, an IGBT, a GaN transistor, or any other suitable wide bandgap transistor.

Resistor 703 is coupled between node 710 and node 707, while resistor 704 is coupled between node 707 and ground supply node 709. In various embodiments, resistors 703 and 704 form a resistive voltage divider which generates a voltage on node 707 using the voltage level of node 710.

Capacitor 705 is coupled between node 710 and ground supply node 709. Diode 708 is coupled between node 710 and bias node 608, and capacitor 706 is coupled between bias node 608 and ground supply node 709.

LDO control circuit 702 is configured to generate signal 711 using a voltage level of node 707. In various embodiments, LDO control circuit 702 may be implemented using a comparator circuit or other suitable amplifier circuit configured to compare the voltage level of node 707 to a reference voltage, and use a result of the comparison to generate signal 711.

In various embodiments, LDO control circuit 702 is configured to drive the gate terminal of field-effect transistor 701 to achieve a setpoint voltage at the source terminal of field-effect transistor 701. In some cases, the setpoint voltage may be about 6 volts. As described above, during startup node 108 is at the pinch-off voltage level, which is transferred via field-effect transistor 701 to bias node 608 in order to startup isolated power supply circuit 609. Once switch circuit 600 is no longer in a startup regime, isolated power supply circuit 609 may, in some embodiments, extract operational power from the converted power such as charge capacitor 706 by way of an auxiliary winding (not shown).

Figure 8:
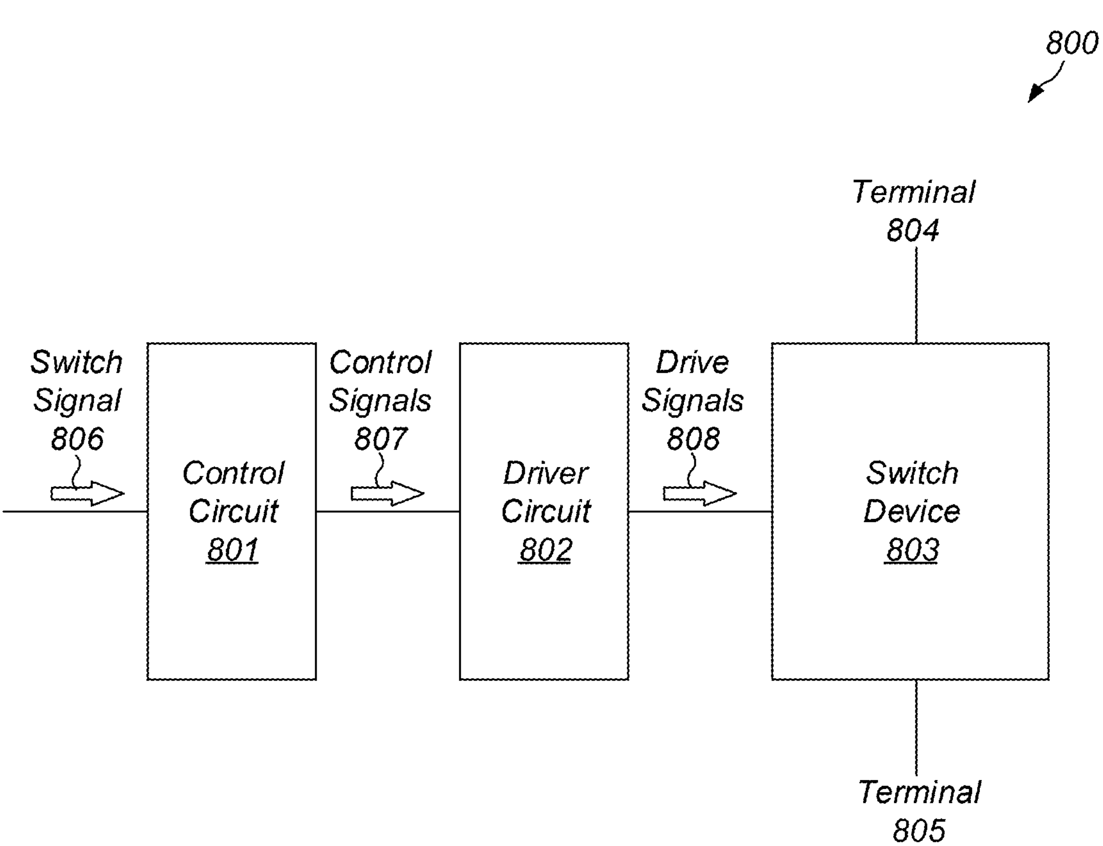
FIG. 8 is a block diagram of an embodiment of a switch subsystem.

Turning to FIG. 8, a block diagram of a switch subsystem is depicted. As illustrated, switch subsystem 800 includes control circuit 801, driver circuit 802, and switch device 803.

Control circuit 801 is configured to generate control signals 807 using switch signal 806. In various embodiments, control signals 807 may correspond to signals 207-209, signals 306-309, signals 407-409, signals 509-512, or control signals 606, depending on which type of driver circuit is employed. Control circuit 801 may be implemented using a controller circuit, and may, in some cases, include isolation circuits to isolate a voltage regime of switch signal 806 from a voltage regime of control signals 807.

Driver circuit 802 is configured to generate drive signals 808 using control signals 807. In various embodiments, drive signals 808 may correspond to voltage levels applied to terminals 105-107 of switch device 100, and a number of drive signals included in drive signals 808 may be based on which type of driver circuit is employed. In different embodiments, driver circuit 802 may correspond to driver circuit 201, driver circuit 301, driver circuit 401, driver circuit 501, or driver circuit 602.

Switch device 803 is coupled between terminals 804 and 805. In various embodiments, a voltage level of terminal 804 is greater than a voltage level of terminal 805. Switch device 803 may, in some embodiments, be configured to allow current to flow from terminal 804 to terminal 805 based on respective voltage levels of drive signals 808. In various embodiments, switch device 803 may correspond to one or more instances of switch device 100 as depicted in FIG. 1.

Turning to FIG. 9, a flow diagram depicting an embodiment of a method for operating a switch circuit with a high-side driver is illustrated. The method, which may be applied to various switch circuits, e.g., switch circuit 200 as depicted in FIG. 2, begins in block 901.

The method includes receiving, by the switch circuit, a switch signal (block 902). In various embodiments, the switch circuit includes a double-base bipolar junction transistor and a first field-effect transistor coupled, in series, between a first terminal and a second terminal. In some embodiments, an upper collector-emitter of the double-base bipolar junction transistor is coupled to the first terminal, and a lower collector-emitter of the double-base bipolar junction transistor is coupled to the first field-effect transistor, which is further coupled to the second terminal. In other embodiments, the first field-effect transistor may be implemented using a SiC device, an IGBT, a GaN transistor, or any other suitable wide bandgap transistor.

The method also includes, in response to activating the switch signal, when a first voltage level of the first terminal is greater than a second voltage of the second terminal, activating the first field-effect transistor (block 903). In various embodiments, activating the first field-effect transistor includes coupling a control terminal of the first field-effect transistor to a voltage level sufficient to activate the first field-effect transistor.

The method further includes, in response to activating the switch signal, coupling an upper-base of the double-base bipolar junction transistor to a voltage source (block 904). In some embodiments, coupling the upper-base of the double-base bipolar junction transistor to the voltage source includes activating a second field-effect transistor coupled between the upper-base of the double-base bipolar junction transistor and the voltage source. The voltage source may, in various embodiments, be implemented using a buck converter circuit or other suitable power converter circuit. In some embodiments, the second field-effect transistor may be implemented using a SiC device, an IGBT, a GaN transistor, or any other suitable wide bandgap transistor.

The method may, in some embodiments, also include, in response to deactivating the switch signal, decoupling the upper-base of the double-base bipolar junction transistor from the voltage source. Additionally, in response to deactivating the switch signal, the method includes coupling a lower-base of the double-base bipolar junction transistor to the second terminal. In various embodiments, coupling the lower-base of the double-base bipolar junction transistor to the second terminal includes activating a third field-effect transistor that is coupled between the lower-base of the double-base bipolar junction transistor and the second terminal. In some embodiments, the third field-effect transistor may be implemented using a SiC device, an IGBT, a GaN transistor, or any other suitable wide bandgap transistor.

In various embodiments, the method may further include deactivating the first field-effect transistor in response to activating the third field-effect transistor. It is noted that, in some embodiments, the lower-base of the double-base bipolar junction transistor may be left electrically floating. In such cases, the first field-effect transistor is deactivated in response to decoupling the upper-base from the voltage source.

In some embodiments, the method may further include transferring, by a startup circuit during a startup operation, power from a lower collector-emitter of the double-base bipolar junction transistor to the voltage source.

As described above, the double-base bipolar junction transistor is symmetric allowing current flow in either direction through the double-base bipolar junction transistor. The symmetric nature of the double-base bipolar junction transistor allows the switch circuit to be operated under reverse bias, i.e., with the second voltage of the second terminal being greater than the first voltage of the first terminal. In such cases, the method further includes, in response to activating the switch signal, coupling the upper-base of the double-base bipolar junction transistor to the voltage source to enable a reverse current to flow from the second terminal to the first terminal through a body diode of the first field-effect transistor and the double-base bipolar junction transistor (block 905).

In some embodiments, the method may further including activating the first field-effect transistor. By activating the first field-effect transistor under reverse bias conditions, current can flow through the first field-effect transistor as well as the body diode of the first field-effect transistor, thereby increasing the reverse current flowing through the switch circuit. The method concludes in block 906.

Turning to FIG. 10, a flow diagram depicting an embodiment of a method for operating a switch circuit with a low-side driver is illustrated. The method, which may be applied to various switch circuits, e.g., switch circuit 300 as depicted in FIG. 3, begins in block 1001. It is noted that method depicted in the flow diagram of FIG. 10 may also include operating the switch circuit under reverse-bias conditions as described above.

The method includes receiving, by a switch circuit, a switch signal (block 1002). In various embodiments, the switch circuit includes a double-base bipolar junction transistor and a first field-effect transistor coupled, in series, between a first terminal and a second terminal. In other embodiments, the first field-effect transistor may be implemented using a SiC device, an IGBT, a GaN transistor, or any other suitable wide bandgap transistor.

In various embodiments, an upper collector-emitter of the double-base bipolar junction transistor is coupled to the first terminal, and a lower collector-emitter of the double-base bipolar junction transistor is coupled to the first field-effect transistor, which is further coupled to the second terminal. In some embodiments, an upper-base of the double-base bipolar junction transistor may be coupled to the first terminal while, in other embodiments, the upper-base of the double-base bipolar junction transistor may be electrically floating.

The method also includes, in response to activating the switch signal, activating the first field-effect transistor (block 1003). In various embodiments, activating the first field-effect transistor includes coupling a control terminal of the first field-effect transistor to a voltage level sufficient to activate the first field-effect transistor.

The method further includes, in response to activating the switch signal, coupling a lower-base of the double-base bipolar junction transistor to a voltage source (block 1004). In various embodiments, coupling the lower-base of the double-base bipolar junction transistor to the voltage source includes activating a second field-effect transistor coupled between the lower-base of the double-base bipolar junction transistor and the voltage source. The voltage source may, in various embodiments, be implemented using a buck converter or other suitable power converter circuit. In some embodiments, the second field-effect transistor may be implemented using a SiC device, an IGBT, a GaN transistor, or any other suitable wide bandgap transistor.

The method may, in some embodiments, also include, in response to deactivating the switch signal, decoupling the lower-base of the double-base bipolar junction transistor from the voltage source. Additionally, in response to deactivating the switch signal, the method may include coupling the lower-base of the double-base bipolar junction transistor to the second terminal. In various embodiments, coupling the lower-base of the double-base bipolar junction transistor to the second terminal includes activating a third field-effect transistor that is coupled between the lower-base of the double-base bipolar junction transistor and the second terminal. In some embodiments, the third field-effect transistor may be implemented using a SiC device, an IGBT, a GaN transistor, or any other suitable wide bandgap transistor.

In various embodiments, the method may further include deactivating the first field-effect transistor in response to activating the third field-effect transistor. In some embodiments, the method may further include transferring, by a startup circuit during a startup operation and using the double-base bipolar junction transistor, power from the first terminal to an isolated power supply circuit coupled to the voltage source. The method concludes in block 1005.

Turning to FIG. 11, a flow diagram depicting an embodiment of a method for operating a switch circuit with a double-side driver is illustrated. The method, which may be applied to various switch circuits, e.g., switch circuit 500 as depicted in FIG. 5, begins in block 1101. It is noted that the method depicted in the flow diagram of FIG. 11 may include operating the switch circuit under reverse-bias conditions as described above.

The method includes receiving, by a switch circuit, a switch signal (block 1102). In various embodiments, the switch circuit includes a double-base bipolar junction transistor and a first field-effect transistor coupled, in series, between a first terminal and a second terminal. In other embodiments, the first field-effect transistor may be implemented using a SiC device, an IGBT, a GaN transistor, or any other suitable wide bandgap transistor.

In various embodiments, an upper collector-emitter of the double-base bipolar junction transistor is coupled to the first terminal, and a lower collector-emitter of the double-base bipolar junction transistor is coupled to the first field-effect transistor, which is further coupled to the second terminal.

The method also includes, in response to activating the switch signal, activating the first field-effect transistor (block 1103). In various embodiments, activating the first field-effect transistor includes coupling a control terminal of the first field-effect transistor to a voltage level sufficient to activate the first field-effect transistor.

The method further includes, in response to activating the switch signal, coupling an upper-base of the double-base bipolar junction transistor to a first voltage source (block 1104). In various embodiments, coupling the upper-base of the double-base bipolar junction transistor to the first voltage source includes activating a second field-effect transistor coupled between the upper-base of the double-base bipolar junction transistor and the first voltage source. The first voltage source may, in various embodiments, be implemented using a buck converter or other suitable power converter circuit. In some embodiments, the second field-effect transistor may be implemented using a SiC device, an IGBT, a GaN transistor, or any other suitable wide bandgap transistor.

The method also includes, in response to activating the switch signal, coupling a lower-base of the double-base bipolar junction transistor to a second voltage source (block 1105). In various embodiments, coupling the lower-base of the double-base bipolar junction transistor to the second voltage source includes activating a third field-effect transistor coupled between the lower-base of the double-base bipolar junction transistor and the second voltage source. The voltage source may, in various embodiments, be implemented using a buck converter or other suitable power converter circuit. In some embodiments, the third field-effect transistor may be implemented using a SiC device, an IGBT, a GaN transistor, or any other suitable wide bandgap transistor.

The method may, in some embodiments, also include, in response to deactivating the switch signal, decoupling the upper-base terminal of the double-base bipolar junction transistor from the first voltage source, and decoupling the lower-base terminal of the double-base bipolar junction transistor from the second voltage source. In various embodiments, decoupling the upper-base terminal of the double-base bipolar junction transistor from the first voltage source includes deactivating the second field-effect transistor, and decoupling the lower-base terminal of the double-base bipolar junction transistor from the second voltage source includes deactivating the third field effect transistor.

Additionally, in response to deactivating the switch signal, the method may include coupling the lower-base of the double-base bipolar junction transistor to the second terminal. In various embodiments, coupling the lower-base of the double-base bipolar junction transistor to the second terminal includes activating a fourth field-effect transistor that is coupled between the lower-base terminal of the double-base bipolar junction transistor and the second terminal. In some embodiments, the fourth field-effect transistor may be implemented using a SiC device, an IGBT, a GaN transistor, or any other suitable wide bandgap transistor.

In various embodiments, the method may further include deactivating the first field-effect transistor in response to activating the third field-effect transistor. In some embodiments, the method may further include transferring, by a startup circuit during a startup operation and using the double-base bipolar junction transistor, power from the first terminal to an isolated power supply circuit coupled to the first voltage source and the second voltage source. The method concludes in block 1106.

Figure 12:
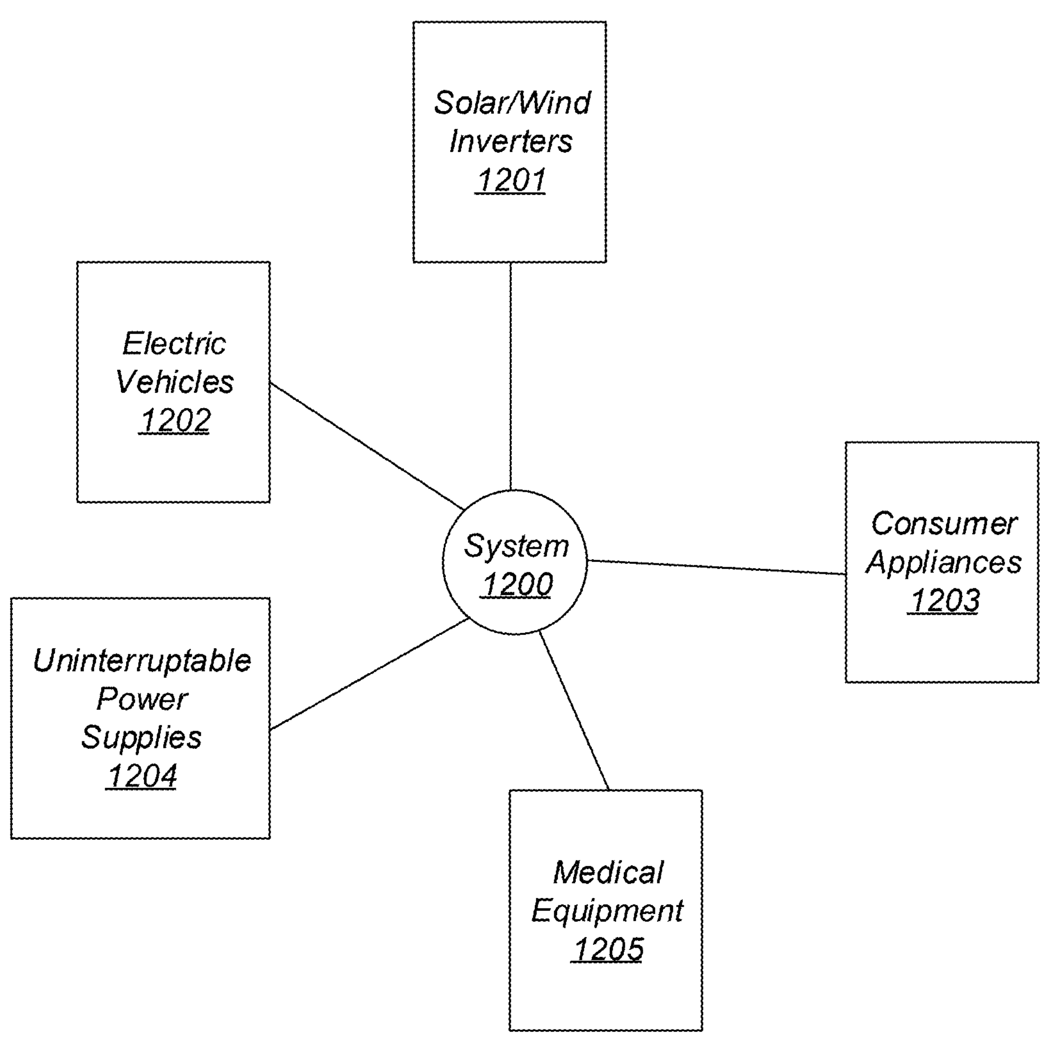
FIG. 12 is a block diagram of various embodiments of systems that may include a hybrid switch circuit.

Turning to FIG. 12, various types of systems that may include any of the circuits, devices, or systems discussed above are illustrated. System or device 1200, which may incorporate or otherwise utilize one or more of the techniques described herein, may be utilized in a wide range of areas. For example, system or device 1300 may be utilized in consumer appliances 1203 such as refrigerators, freezers, electric cooktops and ovens, heating, ventilation, and air conditioning (HVAC) equipment, and the like.

Similarly, disclosed elements may be utilized in medical equipment 1205. Such medical equipment may include x-ray machines, magnetic resonance imaging (MRI) equipment, computed axial tomography (CAT) scanning equipment, and the like. Other types of devices are also contemplated, including any medical applications where switching high currents or voltages is needed.

System or device 1200 may also be employed in other contexts. For example, system or device 1200 may be utilized in the context of solar/wind inverters 1201, or uninterruptable power supplies (UPSs) 1204. Additionally, system or device 1200 may be used in electric vehicles 1202, such as electric cars, electric bicycles, electric scooters, and the like.

The applications illustrated in FIG. 12 are merely examples and not intended to limit the potential future applications of disclosed systems and devices.

The present disclosure includes references to “an embodiment” or groups of “embodiments.” As used herein, embodiments are different implementations of instances of the disclosed concepts. References to “an embodiment,” “some embodiments,” and the like do not necessarily refer to the same embodiment. Many embodiments are possible and contemplated, including those specifically disclosed as well as modifications or alternatives that fall within the spirit or scope of the disclosure.

The above disclosure is meant to illustrate the principles and various embodiments of the disclosed concepts. Numerous variations and modifications will become apparent to those skilled in the art once the above disclosure is fully appreciated. It is intended that the following claims be interpreted to embrace all such variations and modifications.

What is claimed is:

1. An apparatus, comprising:
- a switch device coupled between a first terminal and a second terminal, wherein the switch device includes a double-base bipolar junction transistor and a first field-effect transistor; and
- a driver circuit configured, in response to an activation of a switch signal, to:
  - when a first voltage of the first terminal is greater than a second voltage of the second terminal, activate the first field-effect transistor, and couple an upper-base of the double-base bipolar junction transistor to a voltage source to enable a forward current to flow from the first terminal to the second terminal; and
  - when the first voltage of the first terminal is less than the second voltage of the second terminal, couple the upper-base of the double-base bipolar junction transistor to the voltage source to enable a reverse current to flow from the second terminal to the first terminal through a body diode of the first field-effect transistor and the double-base bipolar junction transistor.

2. The apparatus of claim 1, wherein the driver circuit includes a second field-effect transistor coupled between the upper-base of the double-base bipolar junction transistor and the voltage source, wherein the voltage source is further coupled to the first terminal, and wherein to couple the upper-base of the double-base bipolar junction transistor to the voltage source, the driver circuit is further configured to activate the second field-effect transistor.

3. The apparatus of claim 2, wherein the driver circuit is further configured, in response to a deactivation of the switch signal, to:
- decouple the upper-base of the double-base bipolar junction transistor from the voltage source; and
- couple a lower-base of the double-base bipolar junction transistor to the second terminal.

4. The apparatus of claim 3, wherein the driver circuit is further configured, in response to the deactivation of the switch signal, to deactivate the first field-effect transistor in response to a determination that a particular time period has elapsed since the deactivation of the switch signal.

5. The apparatus of claim 3, wherein the driver circuit further includes a third field-effect transistor coupled between the lower-base of the double-base bipolar junction transistor and the second terminal, and wherein to couple the lower-base of the double-base bipolar junction transistor to the second terminal, the driver circuit is further configured to activate the third field-effect transistor.

6. The apparatus of claim 1, wherein the driver circuit is further configured, in response to the activation of the switch signal, to when the first voltage of the first terminal is less than the second voltage of the second terminal, activate the first field-effect transistor, wherein a first portion of the reverse current flows through the body diode of the first field-effect transistor and a second portion of the reverse current flows through the first field-effect transistor.

7. A method, comprising:
- receiving, by a switch circuit, a switch signal, wherein the switch circuit includes a double-base bipolar junction transistor and a first field-effect transistor coupled, in series, between a first terminal and a second terminal; and
- in response to activating the switch signal:
  - when a first voltage of the first terminal is greater than a second voltage of the second terminal, activating the first field-effect transistor, and coupling an upper-base of the double-base bipolar junction transistor to a voltage source to enable a forward current to flow from the first terminal to the second terminal; and
  - when the first voltage of the first terminal is less than the second voltage of the second terminal, coupling the upper-base of the double-base bipolar junction transistor to the voltage source to enable a reverse current to flow from the second terminal to the first terminal through a body diode of the first field-effect transistor and the double-base bipolar junction transistor.

8. The method of claim 7, further comprising, in response to deactivating the switch signal:
- decoupling the upper-base of the double-base bipolar junction transistor from the voltage source; and
- coupling a lower-base of the double-base bipolar junction transistor to the second terminal.

9. The method of claim 8, further comprising, in response to determining a particular time period has elapsed since deactivating the switch signal, deactivating the first field-effect transistor.

10. The method of claim 8, wherein coupling the upper-base of the double-base bipolar junction transistor to the voltage source includes activating a second field-effect transistor coupled between the upper-base of the double-base bipolar junction transistor and the voltage source, and wherein the voltage source is further coupled to the first terminal.

11. The method of claim 10, wherein coupling the lower-base of the double-base bipolar junction transistor to the second terminal includes activating a third field-effect transistor coupled between the lower-base of the double-base bipolar junction transistor and the second terminal.

12. The method of claim 7, wherein a lower-base of the double-base bipolar junction transistor is electrically floating, and wherein the method further includes, in response to deactivating the switch signal:
- decoupling the upper-base of the double-base bipolar junction transistor from the voltage source; and
- deactivating the first field-effect transistor in response to determining a particular time period has elapsed since the switch signal was deactivated.

13. The method of claim 7, further comprising when the first voltage of the first terminal is less than the second voltage of the second terminal, activating the first field-effect transistor, wherein a first portion of the reverse current flows through the body diode of the first field-effect transistor and a second portion of the reverse current flows through the first field-effect transistor.

14. An apparatus, comprising:
- a switch device coupled between a first terminal and a second terminal, wherein the switch device includes a double-base bipolar junction transistor and a first field-effect transistor; and
- a driver circuit configured, in response to an activation of a switch signal, to:
  - when a first voltage of the first terminal is greater than a second voltage of the second terminal, activate the first field-effect transistor, and couple a lower-base of the double-base bipolar junction transistor to a voltage source to enable a forward current from the first terminal to the second terminal; and when the first voltage of the first terminal is less than the second voltage of the second terminal, couple the lower-base of the double-base bipolar junction transistor to the voltage source to enable a reverse current to flow from the second terminal to the first terminal through a body diode of the first field-effect transistor.

15. The apparatus of claim 14, wherein the driver circuit includes a second field-effect transistor coupled between the lower-base of the double-base bipolar junction transistor and the voltage source, wherein the voltage source is further coupled to the second terminal, and wherein to couple the lower-base of the double-base bipolar junction transistor to the voltage source, the driver circuit is further configured to activate the second field-effect transistor.

16. The apparatus of claim 15, wherein the driver circuit is further configured, in response to a deactivation of the switch signal, to:

decouple the lower-base of the double-base bipolar junction transistor from the voltage source; and couple the lower-base of the double-base bipolar junction transistor to the second terminal.

17. The apparatus of claim 16, wherein the driver circuit further include a third field-effect transistor coupled between the lower-base of the double-base bipolar junction transistor and the second terminal, and wherein to couple the lower-base of the double-base bipolar junction transistor, the driver circuit is further configured to activate the third field-effect transistor.

18. The apparatus of claim 14, wherein an upper-base of the double-base bipolar junction transistor is electrically floating.

19. The apparatus of claim 14, wherein an upper-base of the double-base bipolar junction transistor is coupled to the first terminal.

20. The apparatus of claim 14, wherein the voltage source is coupled to an isolated power supply circuit, and wherein the driver circuit includes a startup circuit configured, during a startup operation, transfer power from a lower collector-emitter of the double-base bipolar junction transistor to the isolated power supply circuit, wherein the first field-effect transistor is inactive, and wherein a third voltage of an upper collector-emitter of the double-base bipolar junction transistor is greater than a fourth voltage of the lower collector-emitter of the double-base bipolar junction transistor.

* * * * *